US012563860B2

(12) United States Patent (10) Patent No.: US 12,563,860 B2
Wu (45) Date of Patent: Feb. 24, 2026

(54) ELECTRODE ASSEMBLY

(71) Applicant: REC SOLAR PTE. LTD., Singapore
(SG)

(72) Inventor: Meng Hsiu Wu, Singapore (SG)

(73) Assignee: REC SOLAR PTE. LTD., Singapore
(SG)

( * ) Notice: Subject to any disclaimer, the term of this
patent is extended or adjusted under 35
U.S.C. 154(b) by 18 days.

(21) Appl. No.: 18/260,002

(22) PCT Filed: Dec. 20, 2021

(86) PCT No.: PCT/EP2021/086836
§ 371 (c)(1),
(2) Date: Jun. 29, 2023

(87) PCT Pub. No.: WO2022/144213
PCT Pub. Date: Jul. 7, 2022

(65) Prior Publication Data
US 2024/0097054 A1 Mar. 21, 2024

(30) Foreign Application Priority Data
Dec. 30, 2020 (GB) .................................... 2020733

(51) Int. Cl.
*H10F 77/30* (2025.01)
*H10F 19/80* (2025.01)
(Continued)

(52) U.S. Cl.
CPC ........... *H10F 77/311* (2025.01); *H10F 19/80*
(2025.01); *H10F 77/211* (2025.01); *H10F*
*77/488* (2025.01); *H10F 10/166* (2025.01)

(58) Field of Classification Search
None
See application file for complete search history.

(56) References Cited

U.S. PATENT DOCUMENTS

2012/0192918 A1 8/2012 Zhou et al.

FOREIGN PATENT DOCUMENTS

AU 2017430968 A1 4/2020
CN 206236680 U 6/2017
(Continued)

OTHER PUBLICATIONS

Great Britian Search Report mailed Aug. 25, 2021 in Great Britain
Application No. GB2020733.8, a corresponding foreign applica-
tion, 1 page.
(Continued)

*Primary Examiner* — Dustin Q Dam
(74) *Attorney, Agent, or Firm* — Lee & Hayes, P.C.

(57) ABSTRACT
An electrode assembly (100) for a solar cell. The electrode
assembly comprises an insulating optically transparent film
(101) comprising a plurality of perforations (103) formed
therein, and a plurality of longitudinally extending, laterally
spaced conductive wire portions (102) arranged side by side
on a surface of the film. One or more of the perforations are
formed so as to have at least a portion thereof interposed
laterally between two wire portions of the plurality of wire
portions. The perforations formed in the film may reduce
losses that would otherwise occur due to absorption of light
by the film. Also disclosed is a solar cell (107) that includes
the electrode assembly described above, a method of form-
ing the electrode assembly, a method of forming the solar
cell, and a method of forming a solar module.

21 Claims, 4 Drawing Sheets

(51) Int. Cl.
  *H10F 77/20*        (2025.01)
  *H10F 77/42*        (2025.01)
  *H10F 10/166*       (2025.01)

(56)                    References Cited

FOREIGN PATENT DOCUMENTS

| | | | | | |
|---|---|---|---|---|---|
| CN | 110518077 | A | * | 11/2019 | |
| DE | 102010004112 | A1 | | 12/2010 | |
| JP | 2013065690 | A | | 4/2013 | |
| KR | 20140114529 | A | | 9/2014 | |
| TW | 560703 | U | | 5/2018 | |
| WO | WO-2016125882 | A1 | * | 8/2016 | ............. H01L 31/05 |
| WO | WO2016199501 | A1 | | 12/2016 | |

OTHER PUBLICATIONS

International Search Report and Written Opinion issued Mar. 24, 2022 in International Application No. PCT/EP2021/086836, 14 pages.

* cited by examiner

ELECTRODE ASSEMBLY

CROSS REFERENCE TO RELATED APPLICATIONS

This application is a U.S. National Phase Application of International Application No. PCT/EP2021/086836 filed Dec. 20, 2021, which claims priority to Great Britain Application No. 2020733.8 filed Dec. 30, 2020, both of which are incorporated herein by reference in their entirety.

FIELD OF THE DISCLOSURE

The present disclosure relates to electrode assemblies for solar cells, solar cells, and methods of manufacturing electrode assemblies and solar cells.

BACKGROUND

Solar modules for providing electrical energy from sunlight comprise an array of solar cells, each comprising a semiconductor substrate. The cells are traditionally connected so that electrical current is routed via a plurality of finger electrodes on the cell surfaces to a series of wider, perpendicular busbar electrodes which are printed on the front and rear sides of the cells. From the busbar electrodes, the electrical current flows to a junction box along a series of copper ribbons, each one soldered to a respective busbar electrode.

To protect solar cells from damage, a glass layer is typically provided that defines the front of the solar module (i.e. the side of the solar cell upon which sunlight is incident in use). An encapsulant is typically provided to attach the glass layer and to fill any gaps between the glass layer and the solar module.

A general aim for solar cell development is to attain high conversion efficiency balanced by a need for reduced production costs. Efforts to achieve this have focussed, in particular, on the electrode connections between the solar cells in a solar cell module and the properties of the semiconductor substrate.

For example, one known arrangement comprises a foil wire electrode assembly in which the busbars are replaced by a plurality of wires arranged on a foil (or film). Bus bars are typically rectangular in cross-section (with the longer dimension parallel to the front surface of the solar cell). The wires of a foil wire electrode assembly, on the other hand, are typically circular in cross-section. For the same cross-sectional area, a circular shape presents less of an obstruction to light than a rectangular shape. Additionally, a circular geometry means that less incident light is reflected directly away from the solar cell. Accordingly, the replacement of bus bars with a plurality of wires can provide a reduction in optical losses that arise from light shading that would otherwise be caused by the presence of busbars. While this can result in increased conversion efficiency, there is an ongoing desire to further improve the efficiency of solar cells, and to maintain that improved efficiency over the operating life of those solar cells.

SUMMARY

According to a first aspect there is provided an electrode assembly for a solar cell, the electrode assembly comprising:
an insulating optically transparent film comprising a plurality of perforations formed therein; and a plurality of longitudinally extending, laterally spaced conductive wire portions arranged side by side on a surface of the film;
wherein one or more of the perforations are formed so as to have at least a portion thereof interposed laterally between two wire portions of the plurality of wire portions.

The film (alternatively referred to as a foil) may provide means for maintaining the conductive wire portions in their spaced arrangement/array when mounted onto the surface of e.g. a layered structure forming part of a solar cell (and comprising a photovoltaic element of the solar cell).

It has been found that, in some cases, the film of a foil-wire electrode assembly can be detrimental to performance. Although such films are optically transparent, some light may be absorbed by the film. This absorption of light may increase over time, for example, where the chemical structure of the film changes due to UV exposure over many years (e.g. forming bubbles in the film or causing yellowing of the film). Light that is absorbed by the film does not reach the layered structure of the solar cell, which may reduce the efficiency of the solar cell. By providing perforations in the film, this loss due to the reduction in transparency over time can be reduced (e.g. minimised). As a result, the short circuit current ($I_{SC}$) of the solar cell may be increased.

Additionally, the perforations may allow for improved penetration of encapsulant between the film and a layered structure of a solar cell (when mounted thereto). Without perforations, to fill any spaces between the film and the layered structure, encapsulant must enter these spaces via the edges of the film. This can mean that the encapsulant is unable to sufficiently penetrate all of the spaces between the film and the layered structure, leaving gaps that can be detrimental to performance. The provision of perforations means that encapsulant can more easily access any spaces between the film and the layered structure by flowing through the perforations. This may ensure better encapsulant coverage, and reduce the possibility of gaps remaining between the film and the layered structure.

The terms "longitudinally" (defined by the direction of the wire portions) and "laterally" refer to directions that are substantially perpendicular to one another.

For the avoidance of doubt, the term "interposed between" means that the two wire portions (of the plurality of side by side wire portions) extend either side of the at least a portion of the perforation. In this way, the perforation is "sandwiched" between the two wire portions (which extend past the at least a portion of the perforation on either side). In other words, a cross-section taken in the lateral direction across the at least a portion of the perforation would also include a portion of each of the two wire portions.

The term "on", as used herein, for example in the phrase "on the surface", is intended to encompass both direct and indirect arrangement on an element such as e.g. a layer, film, or region. Thus, the phrase "on the surface" encompasses arrangements in which one or more intervening layers are provided or, alternatively, in which no intervening layers are provided. In contrast, when an element is referred to as being "directly on" another element (e.g. "directly on the surface"), there are no intervening elements present. Accordingly, in the first aspect, the wire portions may be arranged directly or indirectly on the surface of the film. It will be understood that the terms 'conductive' and 'insulating' as used herein, are expressly intended to mean electrically conductive and electrically insulating, respectively. The meaning of these terms will be particularly apparent in view of the technical context of the invention, being that of photovoltaic solar cell devices.

Optional features will now be set out. These are applicable singly or in any combination with any aspect.

The film may be configured to retain the wire portions on the layered structure of a solar cell. The wire portions may be attached to the film.

The film may comprise a plurality of wire regions on which wire portions are arranged (e.g. attached), and a plurality of non-wire regions between the wire regions (i.e. where no wire portions are arranged). Each perforation may be disposed in a non-wire region of the film (i.e. between conductive wire portions). In other words, the film may be configured such that regions of the film at which wire portions are arranged (e.g. attached) are substantially unperforated (i.e. solid). In this way, the regions of the film that facilitate assembly of the wire portions on a layered structure of a solar cell remain substantially unperforated. This may maintain the ability of the film to perform its retaining function, while minimising the reduction in transmittance caused by the film.

The film may be configured such that wire regions of the film have a lower open area ratio (i.e. the percentage of the region occupied by perforations) than non-wire regions of the film.

Thus, the wire regions may comprise perforations, but to a lesser extent than the non-wire regions. In this way, the non-wire regions of the film may be configured to allow a greater amount of light to pass through (for a given area) than wire regions of the film.

Each wire region may have a width dimension in the transverse direction. The width dimension of each wire region may be greater than the diameter of a corresponding wire portion arranged on the wire region.

The width dimension of each wire region may be greater than 1.5 times the diameter of the corresponding wire portion arranged thereon, or may be 2 times greater, or 3 times greater, or 5 times greater.

The width dimension of each wire region may be greater than 250 μm, or greater than 300 μm, or greater than 400 μm or greater than 500 μm, or greater than 750 μm, or greater than 1000 μm. Such an arrangement may facilitate positioning of wire portions on the film as it may allow minor variation in the positioning of each wire portion while still ensuring that each wire is positioned on a corresponding wire region (e.g. so as to accommodate tolerances in manufacturing equipment for placing the wires).

The perforated area of the film may be greater than 10% of the total area of the film (i.e. the open area ratio of the film may be greater than 10%). The perforated area of the film may be greater than 15%, or 30%, or 40%, or 50% of the total area of the film. The term "perforated area" is used to describe the combined area of the perforations.

The perforated area of the film may be less than 90% of the total area of the film. The perforated area of the film may be less than 85% of the total area of the film, or e.g. less than 70%.

The film may comprise a plurality of longitudinally extending substantially unperforated regions (i.e. wire regions) at which wire portions are arranged, and a plurality of transverse bridges that connect adjacent pairs of longitudinal regions (i.e. wire regions). Each pair of longitudinal regions may be connected by a plurality of longitudinally spaced transverse bridges (i.e. defining perforations therebetween). Each bridge may be a substantially unperforated region of the film. In this respect, the film may take the form of a grid pattern.

The perforations may each be substantially rectangular. The perforations may be formed in other shapes and may, for example, be circular, elliptical or triangular.

The perforations may be arranged in an organised (e.g. repeated) pattern on the film.

Each conductive wire portion (also referred to as wire portions herein) may be an individual wire (or a portion thereof) that is arranged on the film (e.g. extending longitudinally across the film). Alternatively, two or more of the plurality of wire portions may be (e.g. longitudinal) portions of a wire that is arranged on the film e.g. in a serpentine manner.

Each wire portion may be continuous (i.e. without breaks) and may extend across a substantial portion of (e.g. substantially fully across) the film. Each wire portion may extend substantially from one edge of the film to an opposite edge of the film without discontinuities. Each wire portion may extend beyond at least one of the edges of the film.

The plurality of wire portions may be substantially parallel to one another. Accordingly, the plurality of wire portions may define longitudinal spaces therebetween. The perforations may be arranged such that each perforation is located at (i.e. opens to) a longitudinal space (defined between two wire portions). A plurality of perforations may be located at (i.e. may open to) each longitudinal space.

The shape and size of the conductive wire portions may be chosen to optimise the optoelectronic properties of the electrode assembly, i.e. their electric current collection and shading characteristics. Each wire portion may have a circular transverse cross-sectional shape i.e. transverse to their axial length. Alternatively, the wire portions may have different transverse cross-sectional shape, including rectangular and triangular, for example. Alternatively, the or each wire portion transverse cross-section may be obround or irregular.

The wire portions may comprise a conductive metal, or metal alloy. Each of the wire portions may be coated with an alloy coating which comprises an alloy having a low melting point i.e. a melting point lower than the melting point of the conductive metal/metal alloy forming the core of the wire portion. Each wire portion may be completely coated in the alloy coating, or at least partially coated on a side, or sides, which faces the layered structure of the solar cell (when arranged thereon).

The wire portions may be adhered to the film. The wire portions may be partially embedded in the film such that a surface of each wire portion protrudes from the surface of the film. Alternatively, the wire portions may be completely embedded in the film.

The film may be rectangular. The film may have a long dimension and a short dimension. The wire portions may extend in the direction of the short dimension (i.e. the longitudinal direction may be in the direction of the short dimension). In such embodiments, the lateral direction may therefore be in the direction of the long dimension. Alternatively, the wire portions may extend in the direction of the long direction, and the lateral direction may be in the direction of the short dimension.

The film may comprise a polymer material having high ductility, good insulating characteristics, optical transparency and thermal stability, resistance to shrinkage. Exemplary polymer materials may comprise acetate, epoxy resin, fluororesin, polyamide resin, polysulfone, rayon, polyolefin, plastilene, rayonext, polyethylene terephthalate (PET), polyvinyl fluoride film and modified ethylene tetrafluoroethylene, etc.

The surface of the film (i.e. on which the wire portions may be arranged) may be coated with a transparent seal layer (e.g. an adhesive layer). The seal layer may be configured so as to be in a non-adhering state at room temperature, and may be configured to enter an adhering state when heated (i.e. to a temperature above room temperature). Accordingly, during fabrication of the solar cell, the film may be heated so that the seal layer softens to enable adherence of the film to the wire portions due to an application of force. In this way, the wire portions may be at least partially embedded in the seal layer.

In other embodiments, the film may be a unitary (i.e. single layer) film. In other words, the film may be formed of a single material and may be homogenous. The film may be in direct contact with the wire portions arranged thereon (i.e. with no intervening layers provided therebetween). That is, the film may not comprise a seal layer such as that described above. The film may be configured for attachment of the wire portions thereto (as set forth above, the wire portions may be partly or fully embedded in the film).

The film itself may be configured to be in a non-adhering state at room temperature, and may be configured to enter an adhering state (in which the wire portions can be adhered to the film) when heated to a pre-bonding temperature. In this way, the film may be configured to permit attachment of the wire portions thereto without the need for an additional (e.g. seal/adhesive) layer.

The electrode assembly may further comprise one or more reflective elements. Each reflective element may be arranged so as to be superimposed over a respective wire portion of the plurality of wire portions. Thus, the one or more reflective elements may be arranged on or in wire regions (rather than non-wire regions) of the film.

The one or more wire portions may be arranged on an opposing surface of the film to the one or more reflective elements. The film may have a front surface upon which light is incident in use, and a rear surface opposite the front surface. The one or more wire portions may be disposed on the rear surface of the film (e.g. when the film is intended to be positioned on a front surface of a layered structure of a solar cell). The one or more reflective elements may be disposed on the front surface of the film. Such an electrode assembly may be suited for positioning at a front side of a solar cell (i.e. a side upon which light is incident). In this case, the electrode assembly may be referred to as a front electrode assembly.

In an alternative embodiment, the one or more wire portions may be disposed on the rear surface of the film. This arrangement may be suited to an electrode assembly to be positioned on a rear surface of the layered structure of a solar cell. In this case, the electrode assembly may be referred to as a rear electrode assembly.

Each reflective element may be configured to increase the reflection angle of light incident thereon. The term "reflection angle" as used herein refers to the (internal) angle between the direction of the reflected light and a reference line normal to the surface from which the light is reflected. Each reflective element may be configured to increase the reflection angle of light incident thereon, when the electrode assembly is arranged such that light incident thereon is in a direction normal to the non-wire regions of the film.

That is, each reflective element may be configured so as to induce a higher angle of reflection than if the light (e.g. in a direction generally normal to the "plane" of the film) were to be incident on the film below the reflective element. For the avoidance of doubt, the plane of the film is considered to be the reference plane that would pass through planar portions of the film (the non-wire regions) when laid flat, for example, when arranged on a layered structure of a solar cell.

Each reflective element may therefore be configured to provide a greater reflection angle than the film surface to which it is attached (i.e. for light incident on the reflective element/film in a direction generally normal to the plane of the film).

When the electrode assembly is assembled with a layered structure of a solar cell (comprising a photovoltaic element), the film may deform so as to conform to the shape of the wire portions sandwiched between the film and the layered structure (i.e. an outer surface of the layered structure). In other words, the front surface of the film may be substantially planar in non-wire regions, and form ridges/protuberances over the wire portions in the wire regions. In this way, each (e.g. longitudinal) wire region of the film may have a convex (e.g. transverse) profile (i.e. a substantially semi-circular profile). If no reflective element is provided, then light incident on each ridge, especially light incident on the uppermost part of the ridge, would tend to be reflected away from the layered structure (in a substantially perpendicular direction to a front surface of the layered structure). As a result, the reflected light is not absorbed by the layered structure for the production of electricity. The one or more reflective elements increase the angle of reflection, such that a smaller proportion of light is reflected in directions substantially perpendicular to (and away from) the front surface of the layered structure. In this way, more light may be directed towards the layered structure, or at least directed at an angle in which it may be more likely to be reflected back towards the layered structure at the boundary between the solar cell and the atmosphere (thus increasing the amount of light received by the layered structure).

Each reflective element may have a substantially planar reflection surface (e.g. configured to increase the reflection angle of light incident thereon).

Each reflective element may be elongate (e.g. in the longitudinal direction). Each planar reflection surface may be elongate (e.g. in the longitudinal direction).

The reflection surface of each element may be obliquely oriented with respect to the non-wire regions of the film (i.e. the "plane" of the film). The reflection surface of each reflective element may be oriented so as to form an (inner) angle with the front surface of the layered structure of between 30 and 80 degrees, or e.g. between 50 and 70 degrees, or e.g. about 60 degrees.

The reflection surface of each reflective element may be a first reflection surface and each reflective element may comprise a second reflection surface opposite the first reflection surface. Accordingly, the first and second reflection surfaces of each reflective element may define longitudinally extending side walls of the reflective element.

The first and second planar reflection surfaces of each reflective element may be oriented so as to be angled towards one another. As such, respective upper edges of the first and second reflection surfaces of each element may join to define an apex (e.g. a longitudinally extending apex) of the element.

Each reflective element may comprise additional (i.e. more than two) planar reflection surfaces. For example, each reflective element may comprise two further (e.g. third and fourth) planar reflection surfaces, each rearwardly-depending from a respective one of the first and second reflection surfaces. The internal angle between each of the third and fourth planar reflection surfaces and the plane of the film may be greater than the internal angle between each of the first and second planar reflection surfaces and the plane of the film (i.e. the third and fourth planar reflection surfaces may be closer to the perpendicular than the first and second planar reflection surfaces).

In general terms, an upper (or front) surface of each reflective element may be faceted. The transverse cross-sectional shape through an upper surface of each reflective element may be polygonal (i.e. non-curved).

Each reflective element may comprise a polymeric body. Each reflective element may comprise a reflective coating applied to an outer surface of the body. The reflective coating may comprise aluminium. Each reflective element may comprise an adhesive layer for adhering the reflective element to the film.

In a second aspect, there is provided an electrode assembly for a solar cell, the electrode assembly comprising:

an insulating optically transparent film;

a plurality of spaced conductive wire portions attached to a rear surface of the film; and a plurality of reflective elements arranged on a front surface of the film, opposite the rear surface, each reflective element arranged so as to be superimposed over a corresponding wire portion.

The electrode assembly of the second aspect may be as otherwise described above with respect to the first aspect.

In a third aspect there is a solar cell comprising:

a layered structure comprising a photovoltaic element, a plurality of conductive elements arranged on a surface (e.g. outer surface) of the layered structure; and an electrode assembly according to the first or second aspect, the electrode assembly arranged on the plurality of conductive elements such that the conductive wire portions are in ohmic contact with the plurality of conductive elements.

As noted above, the phrase "on" used herein, for example in the phrase "on the surface", is intended to encompass both indirect and direct arrangement on an element. Thus, in the second aspect, the electrode assembly may be arranged indirectly on (with one or more intervening layers) the layered structure or directly on (with no intervening layers) the layered structure.

The conductive wire portions may be provided in place of busbars. Thus, the solar cell may not comprise busbars.

The film may be configured to retain the electrode assembly on the surface of the layered structure (e.g. thereby maintaining ohmic contact between the wire portions and the plurality of conductive elements).

The layered structure may comprise a front surface (e.g. frontmost surface) upon which light is incident in use, and a rear surface (e.g. rearmost surface) opposite the front surface.

The plurality of conductive elements may be arranged on the front surface (i.e. light incident surface) of the layered structure. Thus, the electrode assembly may be arranged on the front surface of the layered structure (with the conductive elements therebetween), and the conductive wire portions may extend across the front surface of the layered structure (i.e. across the plurality of conductive elements arranged on the front surface). As noted above, such an electrode assembly may be referred to as a front electrode assembly.

The plurality of conductive elements may be arranged on the rear surface of the layered structure. Thus, the electrode assembly may be arranged on the rear surface of the layered structure, and the conductive wire portions may extend across the rear surface of the layered structure. Such an electrode assembly may be referred to as a rear electrode assembly.

The solar cell may comprise both front and rear electrode assemblies (and the layered structure may comprise conductive elements on both front and rear surfaces thereof).

Each conductive element of the plurality of conductive elements may be elongate and may extend in a substantially transverse direction. The plurality of conductive elements may comprise finger electrodes. The wire portions may extend across the plurality of conductive elements/finger electrodes in a longitudinal direction. In this respect, the conductive elements/finger electrodes may be substantially perpendicular to the wire portions.

The plurality of conductive elements/finger electrodes may comprise a printed conductive material. The printed conductive material may enable the formation of fine (i.e. narrow width and small depth) finger electrodes on the surface of the layered structure.

The solar cell may comprise an encapsulant received between one or more portions of the film and the layered structure. The solar cell may comprise a protective layer (e.g. a glass layer) overlaid over (i.e. in front of) the film. The encapsulant may be received between the film and the glass layer. The encapsulant may be received between one or more portions of the film and the layered structure.

The layered structure may comprise multiple layers, including the photovoltaic element and at least one emitter layer positioned opposite the photovoltaic element. The at least one emitter layer and the photovoltaic element may form a p-n junction. The emitter layer may be electrically connected to the electrode assembly (the front or rear electrode assembly).

The at least one emitter layer may be arranged towards or at the front surface of the layered structure, and the electrode assembly may be positioned on (e.g. in front of) the emitter layer.

A back surface field layer may be positioned between the photovoltaic element and the rear electrode assembly.

The photovoltaic element may comprise a semiconductor material, such as silicon. The semiconductor material, or a portion thereof, may be positively or negatively doped (i.e. a p-type or an n-type semiconductor). The semiconductor material may not be doped (i.e. it may be an intrinsic semiconductor). The silicon used in the layered structure may be crystalline silicon such as single crystal silicon and polycrystalline silicon or amorphous silicon.

The layered structure may comprise an emitter layer comprising a p-type material, and a back surface field layer comprising an n-type material. The emitter layer and the back surface field layer may be arranged at opposite sides of the photovoltaic element comprising an n-type material. The front electrode assembly may be electrically connected to the emitter layer and the rear electrode assembly may be electrically connected to the back surface field layer. Such an arrangement may define a heterojunction technology (HJT) type solar cell (referred to as a heterojunction solar cell). As such, the emitter layer and the back surface field layer may each comprise amorphous silicon (a-Si:H) and the photovoltaic element may comprise crystalline silicon (c-Si). Of course, the layered structure may take others forms (e.g. the solar cell may not be a heterojunction solar cell).

The layered structure may comprise at least one intrinsic layer i.e. comprising an intrinsic semiconductor. The at least one intrinsic layer may be arranged between the emitter layer of the layered structure and the photovoltaic element to form a front-side passivation layer. Alternatively, or in addition, the at least one intrinsic layer may be arranged between the photovoltaic element and the back surface field layer to form a rear-side passivation layer. The at least one intrinsic layer may comprise amorphous silicon.

When the semiconductor material is an n-type semiconductor, the semiconductor material may be configured to contain impurities of a group V element such as phosphor (P), arsenic (As), and antimony (Sb). When the semiconductor material is a p-type semiconductor material, it may contain impurities of a group III element such as boron (B), gallium (Ga), and indium (In). Alternatively, the semiconductor material may be formed of materials other than silicon.

The surface of the layered structure e.g. the front surface may be textured to form an uneven surface or a surface having uneven characteristics. In this instance, an amount of light incident on the layered structure increases because of the textured surface of the layered structure, and thus the efficiency of the solar cell may be improved.

The layered structure may further comprise an anti-reflection layer, or coating, arranged at the front and/or rear surfaces of the layered structure. The, or each, anti-reflection layer may have a single-layered structure or a multi-layered structure. The anti-reflection layer may be formed of silicon nitride (SiNx) and/or silicon oxide (SiOx). Alternatively, the anti-reflection layer may be formed of a transparent conductive oxide (TCO), such as indium tin oxide (ITO), which has been textured to provide an anti-reflective surface. The anti-reflection layer may advantageously reduce the reflectance of light incident on the solar cell and increase selectivity of a predetermined wavelength band, thereby increasing the efficiency of the solar cell.

In a fourth aspect there is provided a solar module comprising a plurality of solar cells, each according to the third aspect. The solar cells may be electrically coupled to one another.

The plurality of solar cells may comprise first and second solar cells, the conductive wire portions of the first solar cell being electrically coupled to the electrically conductive wire portions of the second solar cell. Accordingly, the plurality of conductive wire portions may form an electrical connection between two or more solar cells in the solar cell module.

The conductive wire portions of the first solar cell may be the same conductive wire portions as the second solar cell (i.e. the conductive wire portions may extend across both first and second solar cells). In this way, the plurality of conductive wire portions may provide a direct electrical connection between the first and second solar cells, which may increase the flow of charge therebetween. Configuring the conductive wire portions in this way may remove the need to provide separate connections (such as copper ribbons) between neighbouring solar cells, which thereby reduces the number and complexity of manufacturing steps required to fabricate the solar module.

The one or more wire portions may extend from (and form part of) a front electrode assembly of the first solar cell to a rear electrode assembly of the second solar cell. Accordingly, the wire portions may be received between a film and a front surface of the layered structure of the first solar cell, and between a film and a rear surface of the layered structure of the second solar cell. As may be appreciated, the second solar cell may be coupled to a third solar cell in a similar manner (i.e. wire portions extending from the front electrode assembly of the second solar cell to the rear electrode assembly of the third solar cell). In this way, a row or string of coupled solar cells may be formed.

In a fifth aspect there is provided a method of forming an electrode assembly for a solar cell, the method comprising arranging a plurality of conductive wire portions on a surface of an insulating optically transparent film having a plurality of perforations formed therein, the arrangement performed such that the wire portions extend longitudinally, are side by side and are laterally spaced from one another with at least a portion of at least one of the perforations interposed laterally between two wire portions of the plurality of wire portions.

The method may comprise forming the film. The method may comprise forming the perforations in the film. The perforations may be formed so as to be arranged as described above with respect to the first aspect.

Thus, for example, the perforations may be formed such that the film comprises regions (wire regions) with no perforations (or at least having a lower open area ratio than other regions). Such regions (i.e. the wire regions) may be elongate in a longitudinal direction. The method may comprise forming spaced longitudinal rows of perforations.

The perforations may be formed by way of a hole punching apparatus, or by other cutting or punching means.

The method may comprise applying heat and/or pressure to the wire portions and/or film to attach the wire portions to the film.

Arrangement of the wire portions on the film may comprise arranging the wire portions at regions of the film having no perforations (or at least having a lower open area ratio than other regions). That is, the method may comprise arranging the wire portions at wire regions (as described above, and with respect to the first aspect) of the film. The method may comprise arranging wire portions between the spaced longitudinal rows of perforations.

In a sixth aspect there is provided a method of forming a solar cell, the method comprising:

forming an electrode assembly according to the method of the fifth aspect;

providing a plurality of conductive elements arranged on a surface (e.g. outer surface) of a layered structure comprising a photovoltaic element; and arranging the electrode assembly on the plurality of conductive elements, such that the conductive wire portions of the electrode assembly are in ohmic contact with the plurality of conductive elements.

The method may comprise forming the plurality of conductive elements on the surface of the layered structure. Forming the plurality of conductive elements on the surface may comprise depositing (e.g. directly) an electrically conductive material onto the surface to form a plurality of elongate finger electrodes.

The electrically conductive material may be deposited (e.g. directly) by various methods including evaporation, plating, printing etc. The method of depositing the electrically conductive material may comprise printing the electrically conductive material onto a surface of the layered structure and then firing the layered structure in a furnace. The electrically conductive material may comprise a metal paste which may be obtained by mixing metal powder and glass frit together with a suitable solvent.

The method may comprise, after arranging the film on the surface of the layered structure, heating the conductive wire portions to form an ohmic contact with the underlying plurality of conductive elements.

In a seventh aspect there is provided a method of forming a solar cell module, the method comprising:

forming a plurality of solar cells according to the method of the sixth aspect; and introducing encapsulant between the film and layered structure of each solar cell via the perforations formed in the film.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which.

DETAILED DESCRIPTION

Aspects and embodiments of the present disclosure will now be discussed with reference to the accompanying figures. Further aspects and embodiments will be apparent to those skilled in the art.

Figure 1:
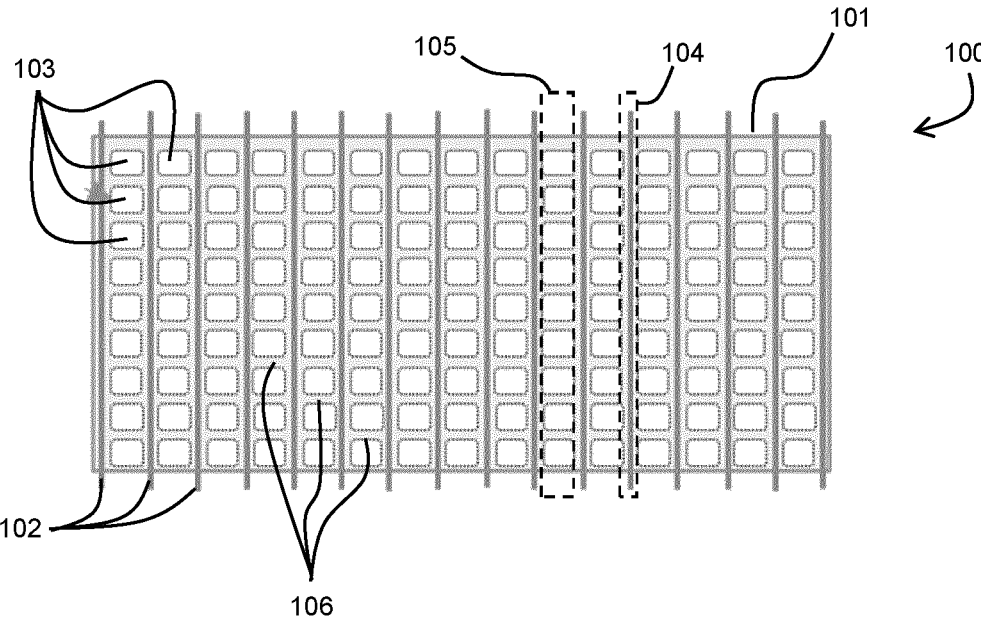
FIG. 1 is a top view of an electrode assembly for a solar cell.

FIG. 1 illustrates an electrode assembly 100 comprising an electrically insulating optically transparent film 101 and a plurality of laterally spaced conductive wire portions (which in this embodiment are individual wires 102) arranged side by side on a surface of the film 101. The film 101 has a plurality of rectangular shaped perforations 103 formed therein. As will be described further below, the electrode assembly 100 is configured for arrangement on a layered structure (comprising a photovoltaic element) of a solar cell for conducting electricity generated by the layered structure of the solar cell (in response to light incident on the solar cell).

The plurality of wires 102 are parallel and extend in a longitudinal direction (the vertical direction in FIG. 1). The spacing of the wires 102 means that longitudinal spaces are defined therebetween. As such, the film 101 comprises regions (referred to herein as wire regions 104) at which wires 102 are attached to the film 101, and regions (referred to as non-wire regions 105) where no wires are attached to the film 101. Each of these wire regions 104 and non-wire regions 105 is elongate in the longitudinal direction.

The perforations 103 are arranged in rows. Each row extends longitudinally and is formed of a plurality of spaced perforations 103. The rows are spaced from one another in the transverse direction (perpendicular to the longitudinal direction). Each row of perforations 103 is positioned in a non-wire region 105 of the film 101. In this way, each row of perforations 103 is interposed between two of the side by side wires 102 attached to the film 101 (such that the wires 102 extend along opposing sides of the row of perforations 103). In other words, the wires 102 are attached to the film such that they extend longitudinally between rows of perforations 103. The wires 102 are therefore attached to non-perforated regions of the film 101 (i.e. the wire regions 104).

By arranging the perforations 103 (and wires 102) in this way, the amount of light that passes through the film 101 (to the layered structure of a solar cell) may be maximised, while still allowing the film 101 to facilitate assembly of the wires 102 onto the layered structure in a spaced apart manner. That is, the film 101 remains unperforated in the wire regions 104, where structure is required to retain a wire 102 on a layered structure of a solar cell, and where any light passing through that region 104 would be blocked by the wire 102 anyway. On the other hand, the film 101 is perforated in non-wire regions 105 where less structure is required to retain the wires 102 on the surface of a layered structure, and where absorption of light by the film 101 could be detrimental to the performance of the solar cell.

The spacing of the perforations 103 in each row means that the longitudinal unperforated wire regions 104 of the film 101 are connected by transverse bridges 106. Thus, the unperforated wire regions 104 remain connected to one another, which ensures that the spacing of the wires 102 is maintained (which would not be the case, for example, if the wire regions 104 were completely separated from one another).

Figure 2:
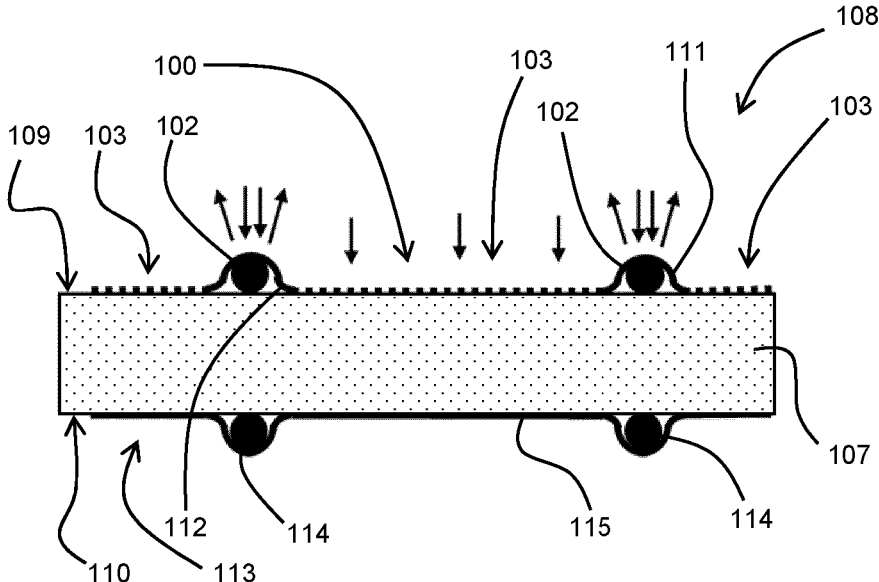
FIG. 2 is a side cross-section view of a portion of a solar cell including the electrode assembly of FIG. 1.

FIG. 2, which is a cross-section taken in the lateral direction, illustrates the electrode assembly 100 assembled with a layered structure of a solar cell 107 (comprising a photovoltaic element) to form a solar cell 108. The layered structure 107 has a front surface 109 (upon which light is incident in normal use as shown by the arrows) and a rear surface 110 opposite the front surface 109. Likewise, the electrode assembly 100 has a front surface 111 (upon which light is incident in normal use) and a rear surface 112 opposite the front surface 111. The electrode assembly 100 is arranged on the front surface 109 of the layered structure 107 such that the rear surface 112 of the electrode assembly 100 is adjacent the front surface 109 of the layered structure 107.

Although not shown in FIG. 2, the front surface 109 of the electrode assembly 100 comprises a plurality of conductive elements are in ohmic contact with the wires 102 of the electrode assembly 100 when the electrode assembly 100 is arranged on the layered structure 107. In this way, electricity generated by the layered structure 107 may flow from the layered structure 107 via the plurality of conductive elements and the wires 102 of the electrode assembly 100. The conductive elements may be transversely extending finger electrodes printed onto the front surface 109 of the layered structure 107.

The electrode assembly 100 may be referred to as a front electrode assembly 100. In addition to the front electrode assembly 100, the solar cell 108 comprises a rear electrode assembly 113. This rear electrode assembly 113 is substantially the same as the front electrode assembly 100 (i.e. it comprises spaced longitudinal wires 114 attached to a film 115), but does not include perforations formed in the film 115 (although, in other embodiments, the rear electrode assembly 113 may include such perforations). The rear surface 110 of the layered structure 107 also comprises a plurality of conductive elements for ohmic contact with the rear electrode assembly 113.

As is apparent from FIG. 2, each wire 102, 114 has a circular transverse cross-sectional shape, and each film 101, 115 (when arranged on the layered structure 107), due to its flexible nature, conforms to the shapes of the wires 102, 114.

As such, at each wire region 104 (see FIG. 1) the film 101, 115 has a convex (i.e. generally semi-circular) transverse cross-sectional shape.

One result of this convex shape (at least with respect to the front electrode assembly 100) is that light incident on the front surface 111 of the electrode assembly 100 is reflected away from the layered structure 107 in a direction that is perpendicular (or close to perpendicular) to the front surface 109 of the layered structure. This reflected light is not absorbed by the layered structure 107, which means it cannot contribute to the electricity generation of the solar cell 108.

Figure 3:
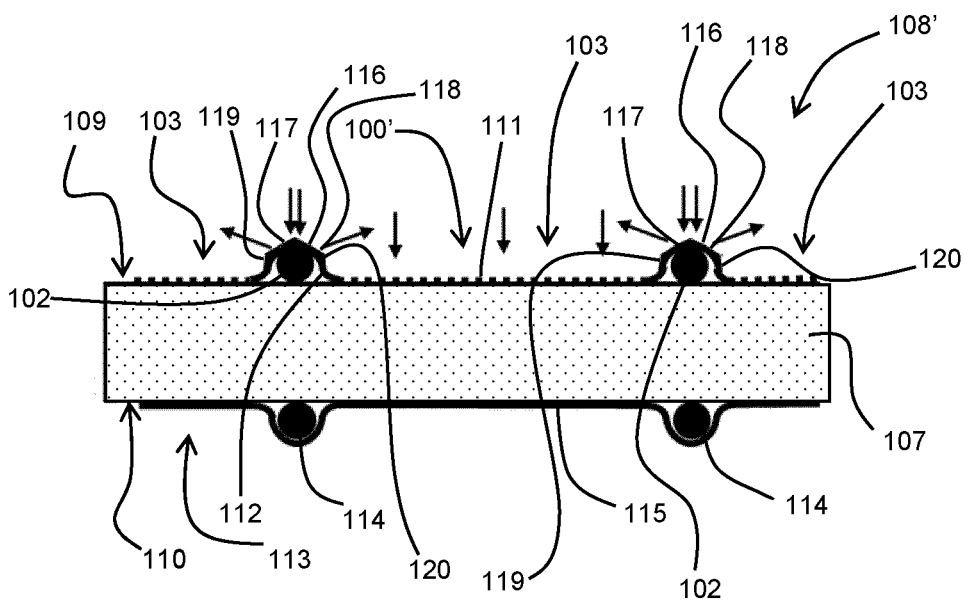
FIG. 3 is a side cross-section view of a portion of a variation of the solar cell of FIG. 2.

FIG. 3 illustrates a solar cell 108' that is a variation of the solar cell 108 of FIG. 2, and which attempts to reduce the amount of light that is reflected away from the layered structure 107 and that can't then be used by the layered structure 107 to produce electricity. Given the similarity between the embodiments of FIG. 3 and FIG. 2, the same reference numerals have been used for corresponding features, and description of those features has not been repeated.

In this variation, the front electrode assembly 100' further comprises longitudinally extending reflective elements 116 (two of which are shown) arranged on the front surface 111 of the film 101. The reflective elements 116 are, in particular, arranged so as to be superimposed over one the wires 102. That is, the reflective elements 116 are arranged on the convex wire regions 104 of the film 101.

Although not illustrated, each reflective element 116 comprises a forward-facing aluminium coating and an adhesive layer that attaches the reflective element 116 to a corresponding wire region 104 of the film.

Each reflective element 116 is configured to increase the reflection angle of light incident thereon. This is apparent from a comparison of the arrows (depicting light rays) of FIGS. 1 and 2. As noted above, the shape of the film 101 at the wire regions 104 of FIG. 1 is such that much of the light is reflected away from the layered structure 107 in a direction substantially perpendicular to the front surface 109 of the layered structure 107. In FIG. 2, on the other hand, the light is incident on the reflective elements 116, which are shaped so as to increase the reflection angle of the incident light, such that the direction of the reflected light is further away from the perpendicular (i.e. the direction perpendicular to the front surface 109 of the layered structure 107).

Even though this doesn't necessarily mean the light will be reflected directly onto the layered structure 107, the increase in reflection angle means that the reflected light is more likely to be reflected again (back towards the layered structure 107) at the boundary between the solar cell and the external environment.

Each reflective element 116 comprises first 117, second 118, third 119 and fourth 120 planar reflection surfaces. Although FIG. 3 only provides a section of each reflective element 116, it should be appreciated that each planar reflection surface 117, 118, 119, 120 extends in the longitudinal direction for the length of the reflective element 116.

The first 117 and second 118 planar reflection surfaces of each reflective element 116 are oriented so as to be angled towards one another. As such, respective upper edges of the first 117 and second 118 reflection surfaces of each element join to define an apex of the reflective element 116. The third 119 and fourth 120 reflection surfaces of each reflective element 116 depend rearwardly (i.e. towards the front surface 109 of the layered structure 107) from respective first 117 and second 118 reflection surfaces of the reflective element 116. The internal angle between the third 119 and fourth 120 planar reflection surfaces and the front surface 109 of the layered structure 107 is greater than the internal angle between each of the first 117 and second 118 planar reflection surfaces and the front surface 109 of the layered structure 107.

Figure 4:
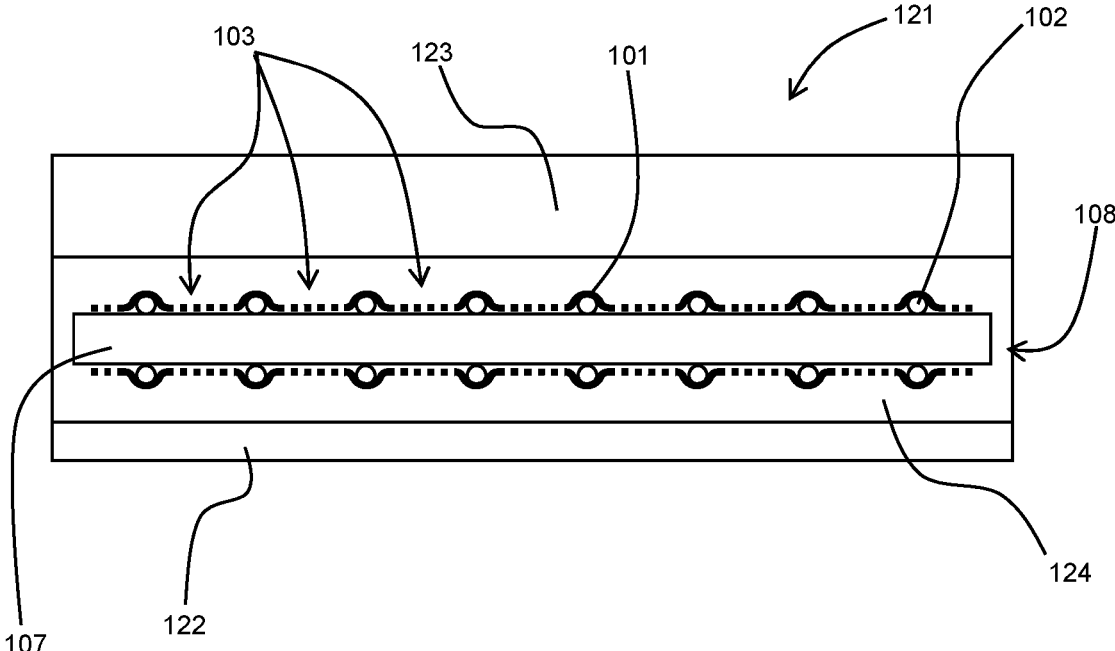
FIG. 4 is a side cross-section view of a portion of a solar cell module, including the solar cell of FIG. 1.

FIG. 4 schematically illustrates a solar cell module 121 incorporating the solar cell 108 of FIG. 2. In addition to the solar cell 108, the module 121 comprises a reflective back plate 122 at a rear side of the solar cell 108 and a protective glass layer 123 at a front side of the solar cell 108. The space defined between the solar cell 108, back plate 122 and glass layer 123 is filled with an encapsulant 124, which helps to secure the various components of the solar module 121 in position.

As may be demonstrated by FIG. 4, the provision of perforations 103 in the film 101 of the solar cell 108 may facilitate flow of encapsulant 124 between the film 101 and the layered structure 107. Without the perforations 103, encapsulant 124 would need to flow into the space between the film 101 and the layered structure 107 via the edges of the film 101. Thus, for example, to fill a gap that is disposed centrally in the space between the film 101 and the layered structure 107, the encapsulant 124 would have to flow a significant distance (from the edge of the film 101 to the centrally located gap). The provision of perforations 103 allows greater access to any spaces between the film 101 and the layered structure 107.

Figure 5:
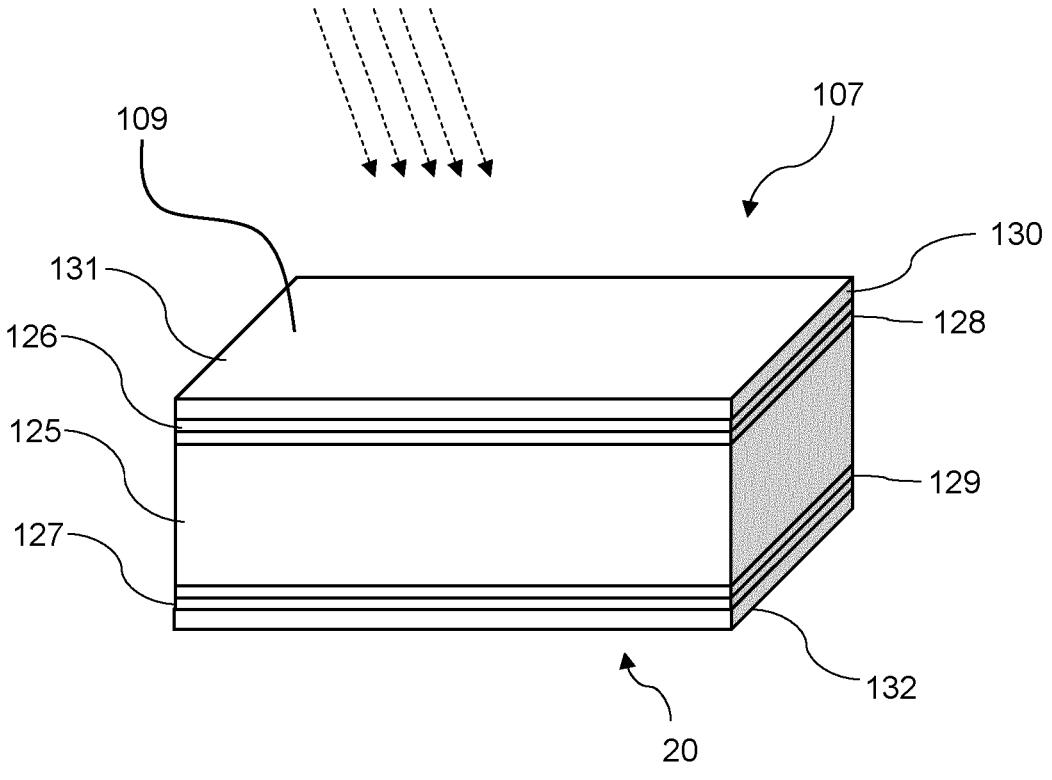
FIG. 5 is a schematic illustrating a layered structure of the solar cell of FIG. 2.

FIG. 5 is a sectional view of the layered structure 107 of the solar cell 108 described above. In this view, the layered structure 107 is shown isolated from the front 100 and rear 113 electrode assemblies. The layered structure 107 comprises a multi-layer semiconductor assembly including a photovoltaic element 125 which is sandwiched between an emitter layer 126 and a back surface field layer 127. As such, the emitter layer 126 and the back surface field layer 127 are arranged at opposite sides of the photovoltaic element 125.

The emitter layer 126 is arranged towards the front surface 109 of the layered structure 107 and the back surface field layer 127 is arranged towards the rear surface 110. The front electrode assembly 100 is electrically connected to the emitter layer 126 and the rear electrode assembly 113 is electrically connected to the back surface field layer 127. Such an arrangement defines a heterojunction technology (HJT) type solar cell. In other embodiments, the layered structure may take other forms (e.g. the solar cell may not be in the form of a HJT type solar cell). For example, in some other embodiments, one or more layers may be absent, one or more layers may be combined together, and/or additional layers may be added, provided that the layered structure 107 can continue to perform its function of generating electricity from incident radiation (e.g. light).

The photovoltaic element 125 is formed of crystalline silicon (c-Si), which is negatively doped (i.e. an n-type material), with impurities of a group V element, such as phosphor (P), arsenic (As), and antimony (Sb). The emitter layer 126 and the back surface field layer 127 are each formed of amorphous silicon (a-Si:H). The amorphous silicon is deposited on the front and rear surfaces of the silicon wafer using PECVD.

The emitter layer 126 comprises a positively doped semiconductor material (i.e. a p-type material), and the back surface field layer 127 comprises an n-type material. The p-type material contains impurities of a group III element such as boron (B), gallium (Ga), and indium (In).

According to the exemplary arrangement of the layered structure 107, the emitter layer 126 defines an impurity region of the layered structure 107 having an opposite conductive type to that of the photovoltaic element 125, and thus forms a p-n junction along with the photovoltaic element 125.

The multi-layer semiconductor assembly further comprises first 128 and second 129 intrinsic layers. Both intrinsic layers 128, 129 are formed of intrinsically doped amorphous silicon. The first intrinsic layer 128 is arranged between the emitter layer 126 and the photovoltaic element 125 to form a front-side passivation layer. In addition, the second intrinsic layer 129 is arranged between the photovoltaic element 125 and the back surface field layer 127 to form a rear-side passivation layer.

Finally, the front surface 109 of the layered structure 107 is covered with transparent conductive coating 130, which is formed of indium tin oxide (ITO). An upper surface 131 of the ITO layer is textured to provide anti-reflective characteristics. The anti-reflection layer advantageously reduces the reflectance of light incident on the solar cell and increases selectivity of a predetermined wavelength band, thereby increasing the efficiency of the solar cell.

The rear surface 110 of the layered structure 107 is also covered with a transparent conductive coating 132 formed of indium tin oxide (ITO). The transparent conductive coatings 130, 132 are configured to increase lateral carrier transport to finger electrodes arranged on the respective surfaces of the layered structure 107. The transparent conductive coatings 130, 132 are particularly advantageous in heterojunction type devices which comprise layers formed of amorphous silicon which exhibit poor carrier mobility.

During operation of the solar cell 108 light is incident upon the layered structure 107, as shown by the arrows at the top of FIG. 5. A plurality of electron-hole pairs are produced through the absorption of the incident photons. The electron-hole pairs are then separated into electrons and holes by a built-in potential difference resulting from the p-n junction. The separated electrons move to the n-type semiconductor in the photovoltaic element 125, and the separated holes move to the p-type semiconductor in the emitter layer 126. Accordingly, the electrons become major carriers in the photovoltaic element 125, and the holes become major carriers in the emitter layer 126. Each of these majority carriers are extracted from the layered structure 107 by the respective electrode assemblies 100, 113.

Figure 6:
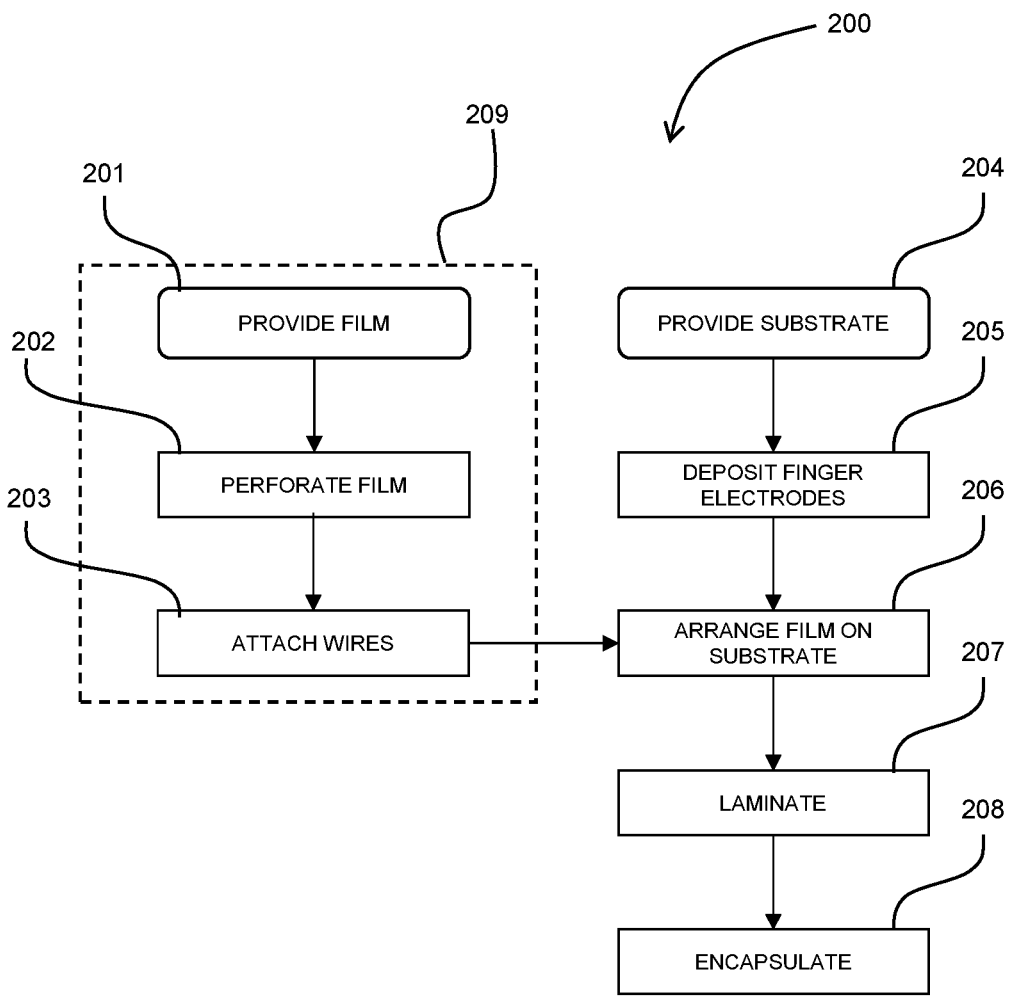
FIG. 6 is a flow chart illustrating a method of forming a solar cell.

FIG. 6 illustrates a method 200 of forming a solar cell, such as those described above. The method includes a first step 201 of providing an insulating optically transparent polymer film. The film is then perforated in a second step 202. This step 202 includes forming a plurality of perforations that are arranged so as to leave longitudinal spaced unperforated regions of the film. In a third step 203, a plurality of longitudinal wires are embedded (e.g. via heat and/or pressure) in the unperforated regions of the film (i.e. so as to extend across the film). These three steps 201, 202, 203, result in the formation of an electrode assembly for a solar cell (i.e. they define a sub-method 209 of forming an electrode assembly).

The method 200 also comprises a fourth step 204 of providing a layered structure and a subsequent fifth step 205 of depositing finger electrodes on a surface of the layered structure. As should be appreciated from FIG. 6, the fourth 204 and fifth 205 steps are independent of the first 201, second 202 and third 203 steps. That is, they can be performed before, concurrently or after the first 201, second 202 and third 203 steps.

The layered structure and electrode assembly are then assembled in a sixth step 206. This involves arranging the electrode assembly on the layered structure such that the wires embedded in the film of the electrode assembly are in ohmic contact with the finger electrodes on the surface of the layered structure.

In a seventh step 207, the wires and film are heated, which causes the film (e.g. a seal layer or adhesive layer of the film, or the film itself) to partially melt so as to secure the wires to the layered structure. This heating also melts an outer alloy coating of the wires (the coating having a reduced melting point), so as to facilitate ohmic contact between the wires and the layered structure. Subsequently, in an eighth step 208 the assembled layered structure and electrode assembly are connected to further solar cells and encapsulated within an encapsulant.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. An electrode assembly for a solar cell, the electrode assembly comprising:
   a film comprising a plurality of perforations formed therein and a plurality of longitudinally extending unperforated regions, wherein the film is insulating and optically transparent;
   a plurality of wire portions, wherein each of the wire portions of the plurality of wire portions are longitudinally extending, laterally spaced conductive wire portions arranged side by side on a surface of the film; and
   wherein one or more of the plurality of perforations are formed so as to have at least a portion of the one or more of the plurality of perforations interposed laterally between two wire portions of the plurality of wire portions, and
   wherein the plurality of wire portions are arranged on the plurality of longitudinally extending unperforated regions of the film.

2. An electrode assembly according to claim 1, wherein the film comprises a plurality of wire regions on which the plurality of wire portions are arranged and a plurality of non-wire regions, wherein a non-wire region of the plurality of non-wire regions is between each of the wire regions of the plurality of wire regions, and wherein the plurality of wire regions of the film have a lower open area ratio than the plurality of non-wire regions of the film.

3. An electrode assembly according to claim 1, wherein a perforated area of the film is greater than 50% of a total area of the film.

4. An electrode assembly according to claim 1, wherein the film comprises a plurality of transverse bridges connecting adjacent pairs of longitudinal regions.

5. An electrode assembly according to claim 1, further comprising one or more reflective elements, each reflective element of the one or more reflective elements arranged so as to be superimposed over a wire portion of the plurality of wire portions.

6. An electrode assembly according to claim 5, wherein each reflective element of the one or more reflective elements is configured to increase the reflection angle of light incident to the electrode assembly.

7. An electrode assembly according to claim 5, wherein each reflective element comprises a reflection surface that is planar.

8. An electrode assembly according to claim 7, wherein the reflection surface of each reflective element is obliquely oriented with respect to non-wire regions of the film.

9. An electrode assembly according to claim 7, wherein the reflection surface of each reflective element is a first reflection surface and each reflective element further comprises a second planar reflection surface, the first and second reflection surfaces oriented so as to be angled towards one another.

10. An electrode assembly according to claim 1, wherein the film is a unitary film formed of a single layer.

11. An electrode assembly according to claim 1, wherein the film is in direct contact with the plurality of wire portions arranged on the film.

12. A solar cell comprising:

a layered structure comprising a photovoltaic element;

a plurality of conductive elements arranged on a surface of the layered structure; and an electrode assembly comprising:

an insulating optically transparent film comprising a plurality of perforations formed therein and a plurality of longitudinally extending unperforated regions; and a plurality of wire portions, wherein each of the wire portions of the plurality of wire portions are longitudinally extending, laterally spaced conductive wire portions arranged side by side on a surface of the film;

wherein one or more of the perforations are formed so as to have at least a portion thereof interposed laterally between two wire portions of the plurality of wire portions, and wherein the electrode assembly is arranged on the plurality of conductive elements such that the conductive wire portions are in ohmic contact with the plurality of conductive elements, and wherein the plurality of wire portions are arranged on the plurality of longitudinally extending unperforated regions.

13. A solar cell according to claim 12, wherein the layered structure comprises a front surface upon which light is incident in use, and a rear surface opposite the front surface, the electrode assembly arranged on the front surface of the layered structure.

14. A solar cell according to claim 12, wherein an encapsulant is received between one or more portions of the film and the layered structure.

15. A solar cell according to claim 1, wherein the solar cell is a heterojunction solar cell.

16. A method of forming an electrode assembly for a solar cell, the method comprising arranging a plurality of conductive wire portions on a surface of an insulating optically transparent film having a plurality of perforations and a plurality of longitudinally extending unperforated regions, the arrangement performed such that the plurality of conductive wire portions extend longitudinally, are side by side, and are laterally spaced, wherein the plurality of conductive wire portions are arranged on the plurality of longitudinally extending unperforated regions; and interposing at least a portion of at least one of the plurality of perforations laterally between two wire portions of the plurality of conductive wire portions.

17. A method according to claim 16, further comprising forming spaced longitudinal rows of perforations.

18. A method according to claim 17, wherein arranging the plurality of conductive wire portions on the surface of the film comprises arranging each wire portion between two spaced longitudinal rows of perforations.

19. A method according to claim 16, further comprising:

providing a plurality of conductive elements arranged on a layered structure comprising a photovoltaic element; and arranging the electrode assembly on the plurality of conductive elements, such that the plurality of conductive wire portions of the electrode assembly are in ohmic contact with the plurality of conductive elements.

20. A method according to claim 19, further comprising:

introducing an encapsulant between the film and layered structure of each solar cell via the plurality of perforations formed in the film of each solar cell.

21. An electrode assembly according to claim 1, wherein the plurality of perforations are arranged in rows, each row comprising a plurality of spaced perforations and extending longitudinally along the film parallel to the plurality of wire portions, and wherein each row is interposed between two wire portions.

* * * * *